United States Patent [19]

Schieman

[11] Patent Number: 5,440,229
[45] Date of Patent: Aug. 8, 1995

[54] FUNDAMENTAL VOLTMETER

[75] Inventor: Robert G. Schieman, Bogart, Ga.

[73] Assignee: Reliance Electric Industrial Company, Cleveland, Ohio

[21] Appl. No.: 326,754

[22] Filed: Oct. 20, 1994

Related U.S. Application Data

[63] Continuation of Ser. No. 82,353, Jun. 24, 1993, abandoned, which is a continuation-in-part of Ser. No. 836,386, Feb. 18, 1992, abandoned.

[51] Int. Cl.$^6$ ............................................. G01R 19/18
[52] U.S. Cl. .................................. 324/76.44; 324/118; 324/115; 363/39; 363/42
[58] Field of Search ............... 324/76.44, 76.45, 76.46, 324/76.29, 115, 118; 363/39, 42, 40, 41

[56] References Cited

U.S. PATENT DOCUMENTS

| | | | |
|---|---|---|---|
| 1,663,086 | 3/1928 | Long | 324/76.39 |
| 2,576,249 | 11/1951 | Barney | 324/76.44 |
| 2,887,654 | 5/1959 | Strassman | 324/76.39 |
| 3,502,904 | 3/1970 | Bordonaro | 324/76.39 |
| 4,045,731 | 8/1977 | Tokunou | 324/76.44 |

OTHER PUBLICATIONS

Belleson: "Wideband Frequency Demodulator"–IBM Tech. Disclosure Bulletin–Mar. 1967–pp. 1464–1466.

Primary Examiner—Kenneth A. Wieder
Assistant Examiner—Jose M. Solis
Attorney, Agent, or Firm—James A. Hudak

[57] ABSTRACT

Apparatus is disclosed for measuring the fundamental voltage, fundamental frequency and the fundamental voltage divided by the fundamental frequency of the output of a device, such as an inverter. Through the use of an isolation amplifier connected across the output of the inverter and proper component selection, the output signal produced by the isolation amplifier is representative of the fundamental voltage of the output of the inverter divided by the frequency of the fundamental voltage. The output signal from the isolation amplifier is converted into a pulse having a fixed width w, fixed height h and period 1/f to produce a signal representative of the fundamental frequency of the output of the inverter. The output signal from the isolation amplifier is also rectified and applied to a multiplier along with a signal having a fixed width w, height $E_{in}/f$ and period 1/f and then averaged to produce an output signal representative of the fundamental voltage of the output of the inverter.

8 Claims, 7 Drawing Sheets

FUNDAMENTAL VOLTMETER

This is a continuation of application(s) Ser. No. 08/082,353 filed on Jun. 24, 1993, which is a continuation-in-part of U.S. Ser. No. 07/836,386, filed Feb. 18, 1992, both abandoned.

TECHNICAL FIELD

The present invention relates, in general, to an apparatus for measuring parameters which define a signal and, more particularly, to apparatus which measures the fundamental voltage and fundamental frequency of a voltage signal.

BACKGROUND ART

When dealing with AC signals, circuit designers usually are concerned with rms voltage values. However, AC measurements typically involve a complex interaction among signal amplitude, harmonic content and phase relationships. With respect to ac motors, fundamental voltage, rather than total rms voltage (fundamental voltage plus harmonics), is the parameter which is adjusted to meet motor nameplate voltage. For example, AC motor torque is a function of fundamental voltage. If the total rms voltage applied to the motor is set so as to be equal to the motor nameplate voltage, the motor will produce a torque less than that which could be safely attained if a fundamental voltage substantially equal to the motor nameplate voltage had been applied to the motor. Similarly, motor speed is a function of the frequency of the fundamental voltage. Thus, by setting the frequency of the fundamental voltage to that indicated on the motor nameplate, the motor speed on the nameplate will be achieved.

Voltmeters for measuring parameters, such as fundamental voltage, are presently available, however, such voltmeters are costly and quite bulky. In addition, the resulting measurements from such voltmeters are quite inaccurate.

Because of the desirability of measuring fundamental voltage and fundamental frequency, and the inherent problems associated with presently available apparatus to measure same, it has become desirable to develop a voltmeter which accurately measures the fundamental voltage of a signal and the frequency of the fundamental voltage.

SUMMARY OF THE INVENTION

The present invention solves the problems associated with prior art measuring devices and other problems by providing apparatus for measuring the fundamental voltage, the fundamental frequency and the fundamental voltage divided by the fundamental frequency of the output of a device, such as an inverter. The foregoing is accomplished through the use of an isolation amplifier which is connected across two phases of the output of the inverter. By proper selection of components, the AC output signal from the isolation amplifier is representative of the fundamental voltage of the output of the inverter divided by the frequency of the fundamental voltage. The output signal from the isolation amplifier is applied to a comparator which converts same into a square wave having a frequency representative of the fundamental frequency of the output of the inverter. The square wave is converted into a pulse having a fixed width w, fixed height h and period 1/f which is then utilized to produce a DC output signal representative of the fundamental frequency of the output voltage of the inverter. In addition, the AC output signal from the isolation amplifier is processed by an absolute value and filter circuit which rectifies and filters same into a DC signal which is applied to a multiplier and amplifier circuit. The fixed pulse width from the comparator is also applied to the multiplier and amplifier circuit which averages a signal having a fixed width w, height $E_{in}/f$ and period $1/f$ to produce a DC output signal representative of the fundamental voltage of the output of the inverter.

DESCRIPTION OF THE PREFERRED EMBODIMENT

Figures 1, 2:
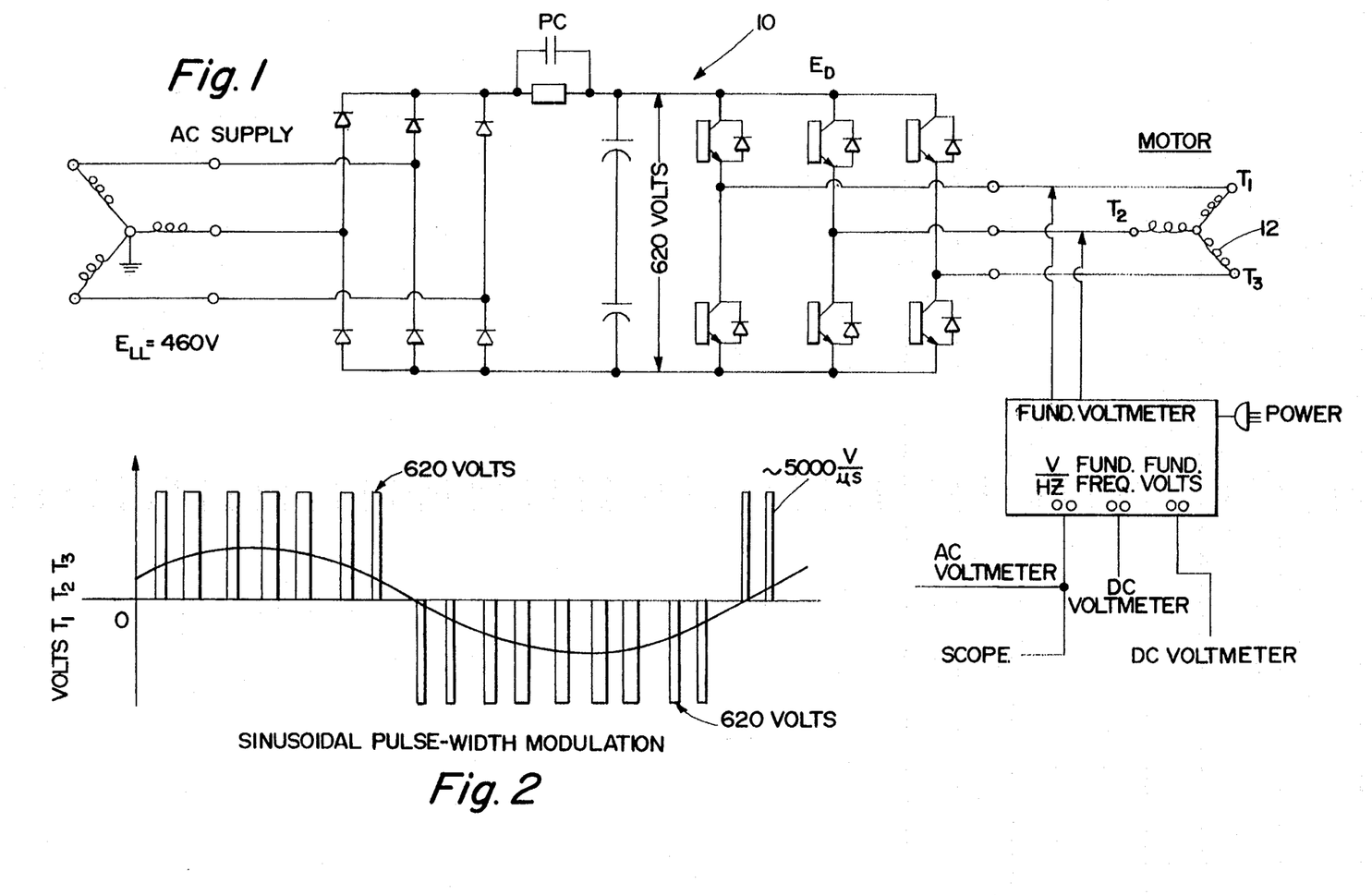
FIG. 1 is a schematic drawing of a three-phase inverter system supplying power to a three-phase induction motor and illustrates the connection of the fundamental voltmeter of the present invention to two output phases of the inverter.
FIG. 2 illustrates the fundamental output voltage waveform of the inverter system shown in FIG. 1.

Referring now to the drawings where the illustrations are for the purpose of describing the preferred embodiment of the present invention and are not intended to limit the invention described herein, FIG. 1 is a schematic diagram of a typical three-phase pulse width modulated inverter, shown generally by the numeral 10, which supplies power to a three-phase induction motor 12 and which illustrates the connection of the fundamental voltmeter 14 of the present invention across two output phases of the inverter. As shown in FIG. 2, which illustrates a typical fundamental output voltage waveform of the inverter, such a waveform consists of numerous pulses per second, e.g., 3000 pulses per second. The width of each pulse may differ so that the motor current produced by the pulses is sinusoidal. As can be seen, the output voltage waveform includes many zeroes and numerous positive and negative slopes making the use of a counter to measure fundamental frequency impractical. In addition, the rise time of the output voltage may be 5000 volts/$\mu$ second and the output voltage may be 310 to 610 volts above ground. With respect to prior art measuring devices, this output voltage is typically capacitive coupled across the device resulting in inaccurate readings. Furthermore, the output voltage of the inverter may also include a DC component resulting from unequal voltage drops across the transistor switches within the inverter or inaccurate inverter regulator pulse width generation.

Figure 3:
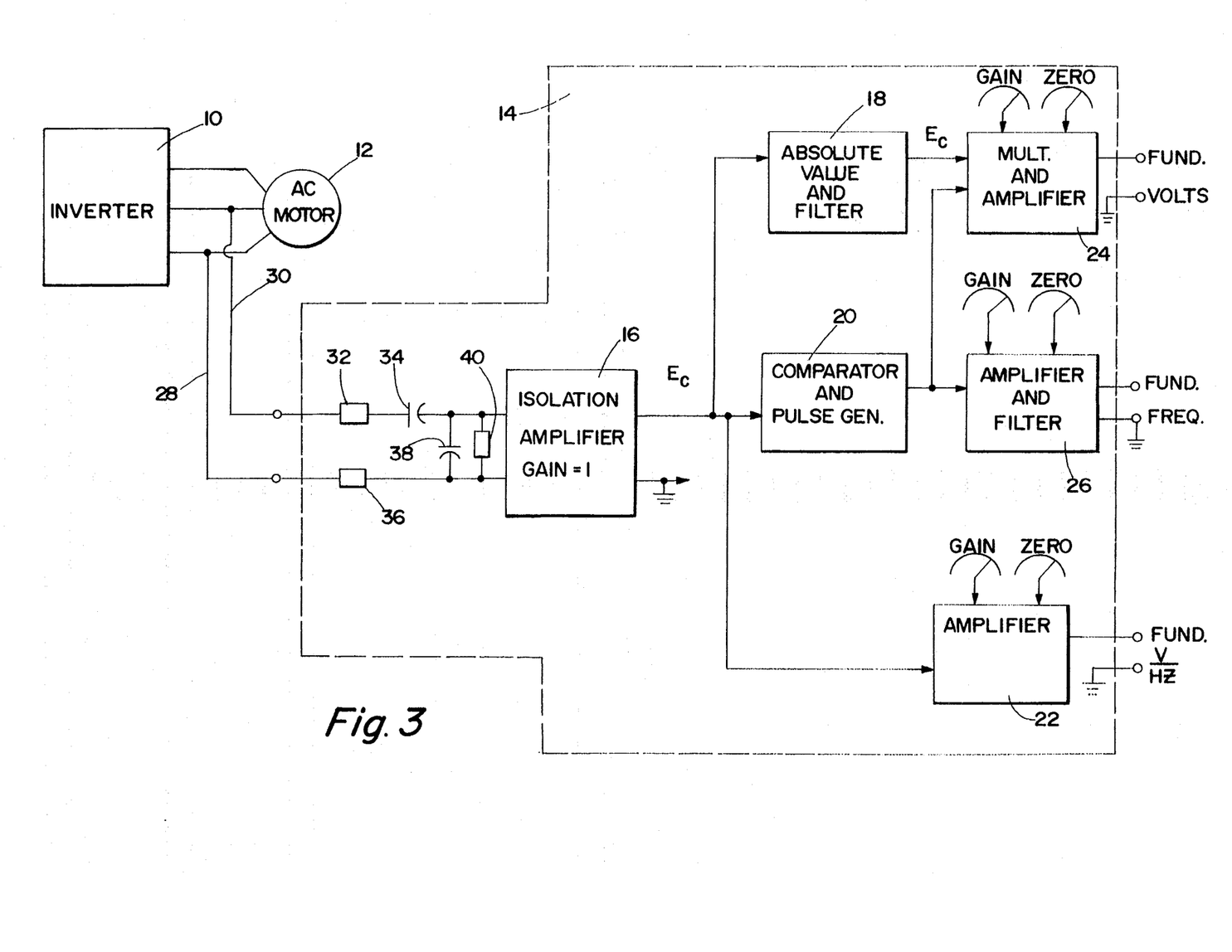
FIG. 3 is a schematic drawing of the fundamental voltmeter of the present invention.

The fundamental voltmeter 14 of the present invention is illustrated in FIG. 3 and is comprised of an isolation amplifier 16 connected across two output phases of the inverter 10; an absolute value and filter circuit 18, a comparator and pulse generator circuit 20, and an amplifier 22, all connected to the output of the isolation amplifier 16; a multiplier and amplifier circuit 24 connected to the output of the absolute value and filter circuit 18 and to the output of the comparator and pulse generator circuit 20; and an amplifier and filter circuit 26 is also connected to the output of the comparator and pulse generator circuit 20.

The inverter 10 converts DC power to three-phase AC power which is supplied to the motor 12. The operation of the inverter 10 is readily known and thus will not be described further. Leads 28 and 30 are connected across two output phases of the inverter 10. Lead 30 is connected to a series combination of a resistor 32 and a capacitor 34. Capacitor 34 prevents low DC voltage (1 to 3 volts) on the motor from causing circuit malfunction and also protects the isolation amplifier 16 from high DC voltages if the leads 28 and 30 are attached to the inverter DC bus. The capacitor 34 is connected to an input to isolation amplifier 16. Lead 28 is connected to a resistor 36 which is connected to the other input to isolation amplifier 16. A parallel combination of a capacitor 38 and a resistor 40 is connected across the foregoing inputs to the isolation amplifier 16. The total resistance of resistor 32 and resistor 36 is approximately one megohm and the value of resistor 40 is approximately 10 megohms. The value of each capacitor 34 and 38 is approximately 1 microfarad. The output of isolation amplifier 16 is connected to the respective inputs to absolute value and filter circuit 18, comparator and pulse generator circuit 20 and amplifier 22. The other output of isolation amplifier 16 is connected to ground potential. It should be noted that isolation amplifier 16 is a three-port isolation system, such as Analog Devices Model NO. AD 210AN, having sufficient integrity to isolate and reject the large dv/dt voltage to ground that can be produced by a pulse width modulated inverter. The output of absolute value and filter circuit 18 is connected to an input to multiplier and amplifier circuit 24 whose other input is connected to the output of comparator and pulse generator circuit 20. The DC output signal produced by multiplier and amplifier circuit 24 is representative of the fundamental voltage of the output of inverter 10. The output of comparator and pulse generator circuit 20 is also connected to an input to amplifier and filter circuit 26, as previously described. The DC output signal produced by amplifier and filter circuit 26 is representative of the fundamental frequency of the output voltage produced by inverter 10. The AC output signal produced by amplifier 22 is representative of the fundamental voltage of the output of the inverter 10 divided by the frequency of the fundamental voltage.

As shown in FIG. 3, a resistance-capacitance circuit comprising resistors 32, 36 and capacitors 34, 38 interconnects the output of the inverter 10 with the input to the isolation amplifier 16. Assuming that the resistor in this circuit has a resistance of approximately 1 megohm and that the value of each capacitance is approximately 1 microfarad, the transfer function for this circuit can be defined as follows:

$$E_{OUT} = \frac{E_{IN}}{R + \frac{1}{\frac{1}{2}CS}} \cdot \frac{1}{CS} = \frac{\frac{1}{2}E_{IN}}{R\frac{C}{2}S + 1} \quad (1)$$

$$\text{IF } R\frac{C}{2}S >> 1 \quad (2)$$

$$E_{OUT} \simeq \frac{\frac{1}{2}E_{IN}}{R\frac{C}{2}S} = \frac{E_{IN}}{RCS} = \frac{E_{IN}}{RC[2\pi f]} \quad (3)$$

$$E_{OUT} \simeq .159 \frac{E_{IN}}{f} \quad f = \text{frequency} \quad (4)$$

Thus, assuming that the value of rs >> 1, then the output voltage $E_{out}$ of this resistance-capacitance circuit is approximately equal to the input voltage $E_{in}$ divided by the frequency, the resultant being multiplied by a constant k. With the values utilized for the components in fundamental voltmeter 14 of the present invention, viz., total resistance of resistors 32 and 36 being approximately 1 megohm and the value of each capacitor 34 and 38 being approximately 1 microfarad, the foregoing assumption is appropriate and thus the relationship between output voltage and input voltage as set forth in Equation (4) is correct.

The output voltage of the inverter 10 consists of a torque producing fundamental voltage, possibly a small DC component, and higher frequency voltage harmonics. The DC component is blocked by capacitor 34. Typically, the first significant harmonic is the fifth harmonic which can have a magnitude of up to 20% of the fundamental voltage. Referring to Equation (3), the effect of this fifth harmonic is reduced from 20% to approximately 4%, and the error in the output voltage as a result of the fifth harmonic is:

$$E_{OUT} = \sqrt{(\text{FUND.})^2 + (\text{5th HARM})^2} = \sqrt{E_{IN}^2 + (.04\ E_{IN})^2} \quad (5)$$

$$E_{OUT} = 1.0008\ E_{IN} \text{ or } .08\% \text{ ERROR}$$

Similarly, higher frequency (7th, 11th, 13th . . . ) harmonics are also of inconsequential value.

The output voltage waveform from the isolation amplifier 16 is a sine wave which most meters can measure accurately. One output of the isolation amplifier 16 is at ground potential preventing false circuit operation and inaccurate meter measurements due to circuit capacitance to ground and meter capacitance to ground effects. This is not true if the meter is common to the inverter output. In addition, the isolation amplifier 16 protects the operator of the meter from the possibility of connecting 460 volts (the output of inverter 24) to ground.

Figures 4, 5:
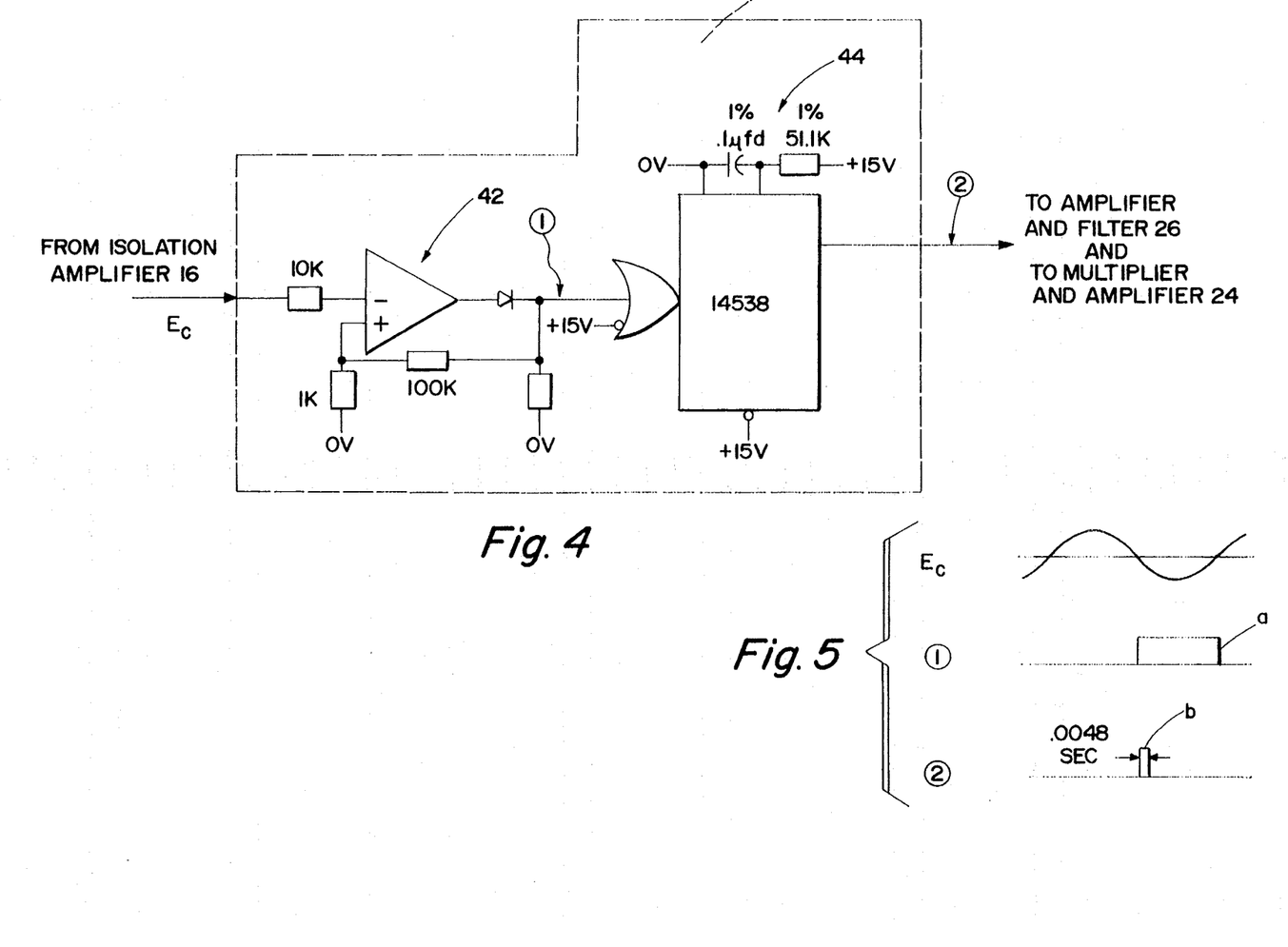
FIG. 4 is a schematic diagram of the comparator and pulse generator circuit utilized by the present invention.
FIG. 5 illustrates a series of waveforms at the output of the isolation amplifier and at various points in the comparator and pulse generator circuit shown in FIG. 4.
Figure 6:
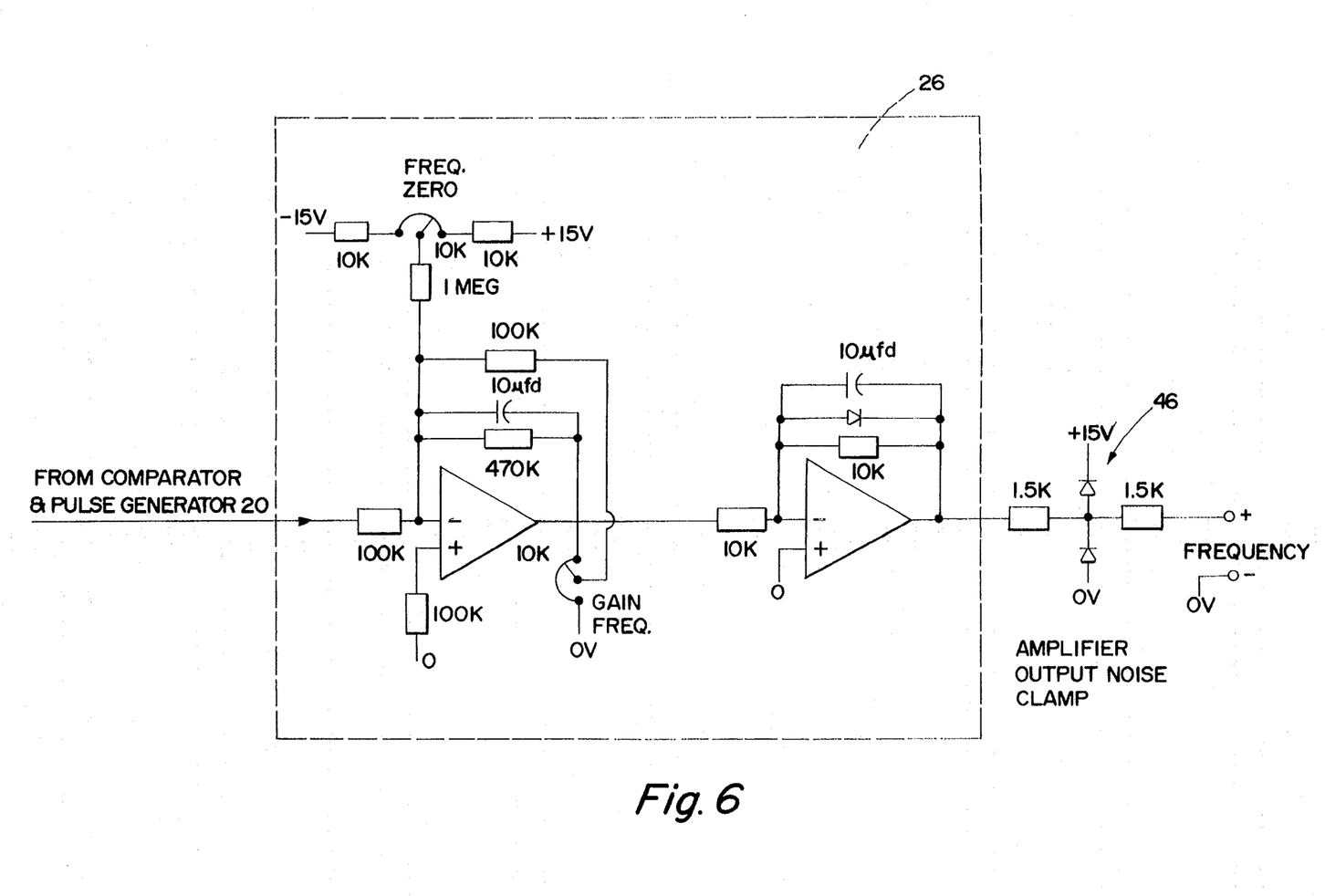
FIG. 6 is a schematic diagram of the amplifier and filter circuit utilized by the present invention.

Inasmuch as the isolation amplifier 16 has a gain of 1, its output voltage, shown as $E_c$ in FIG. 3, is also $kE_{in}/f$ wherein f represents the fundamental frequency of the output voltage of the inverter 10. The output signal $E_c$ produced by isolation amplifier 16 is converted into a square wave a, illustrated in FIG. 5, by the comparator portion 42 of comparator and pulse generator circuit 22, illustrated in FIG. 4. The frequency of the resulting square wave is the same as the fundamental frequency of the output voltage of the inverter 10. The square wave a is subsequently converted into a pulse b having a fixed width w, fixed height h and period (1/f) by the generator portion 44 of comparator and pulse generator 16. The period of the resulting pulse b is the same as the period of the foregoing square wave and the period of the output voltage of the inverter 10. The pulse b is amplified and filtered by amplifier and filter circuit 26, illustrated in FIG. 6, to produce a DC output signal representative of the fundamental frequency of the output voltage of the inverter 10, in accordance with the following equation:

$$\frac{wh}{\text{Period}} = \frac{wh}{1/f} = whf = kf \qquad (6)$$

where
w = width of pulse
h = height of pulse
f = frequency
k = constant

The foregoing DC output signal varies directly with the fundamental frequency of the output voltage of the inverter 10. Due to the significant amount of electrical noise in the vicinity of a pulse width inverter, the output of amplifier and filter circuit 26 is protected by a voltage clamp 46. It should be noted that if the two capacitors utilized in amplifier and filter circuit 26 are removed, the output of circuit 26 would be a pulse, rather than a DC signal, which could be utilized as an input to a counter (not shown). In this manner, the total of a series of pulses would be representative of the fundamental frequency of the output voltage of the inverter 10.

Figure 7:
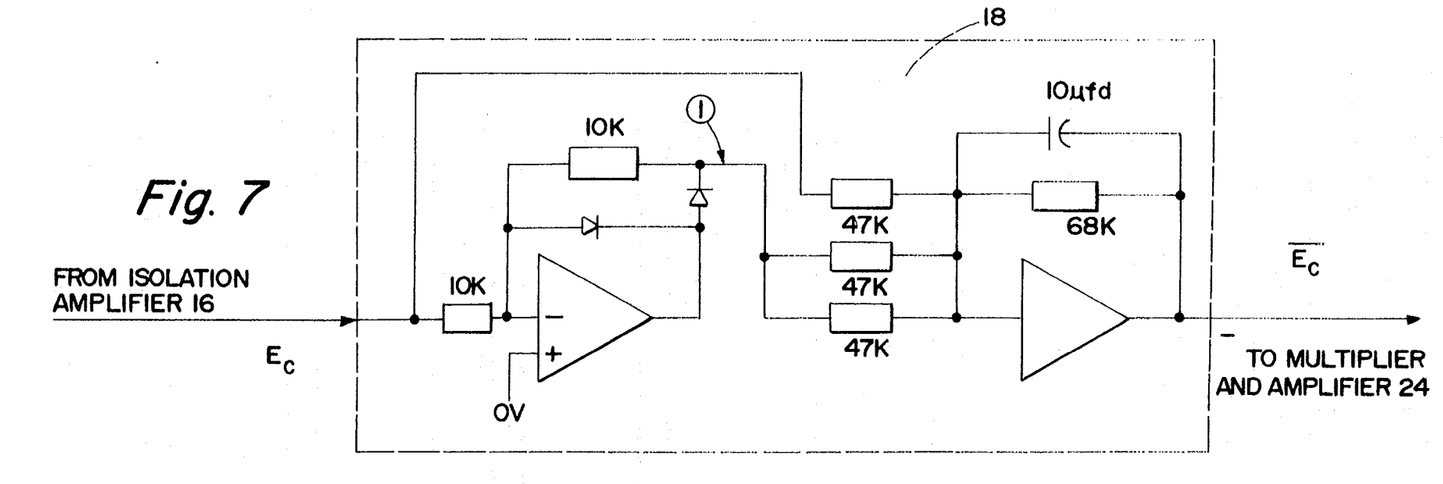
FIG. 7 is a schematic diagram of the absolute value and filter circuit utilized by the present invention.
Figure 8:
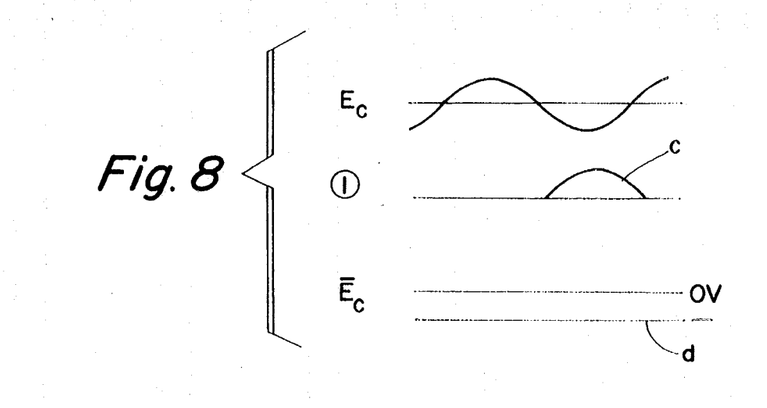
FIG. 8 illustrates a series of waveforms at the output of the isolation amplifier and at various points in the absolute value and filter circuit shown in FIG. 7.
Figure 9:
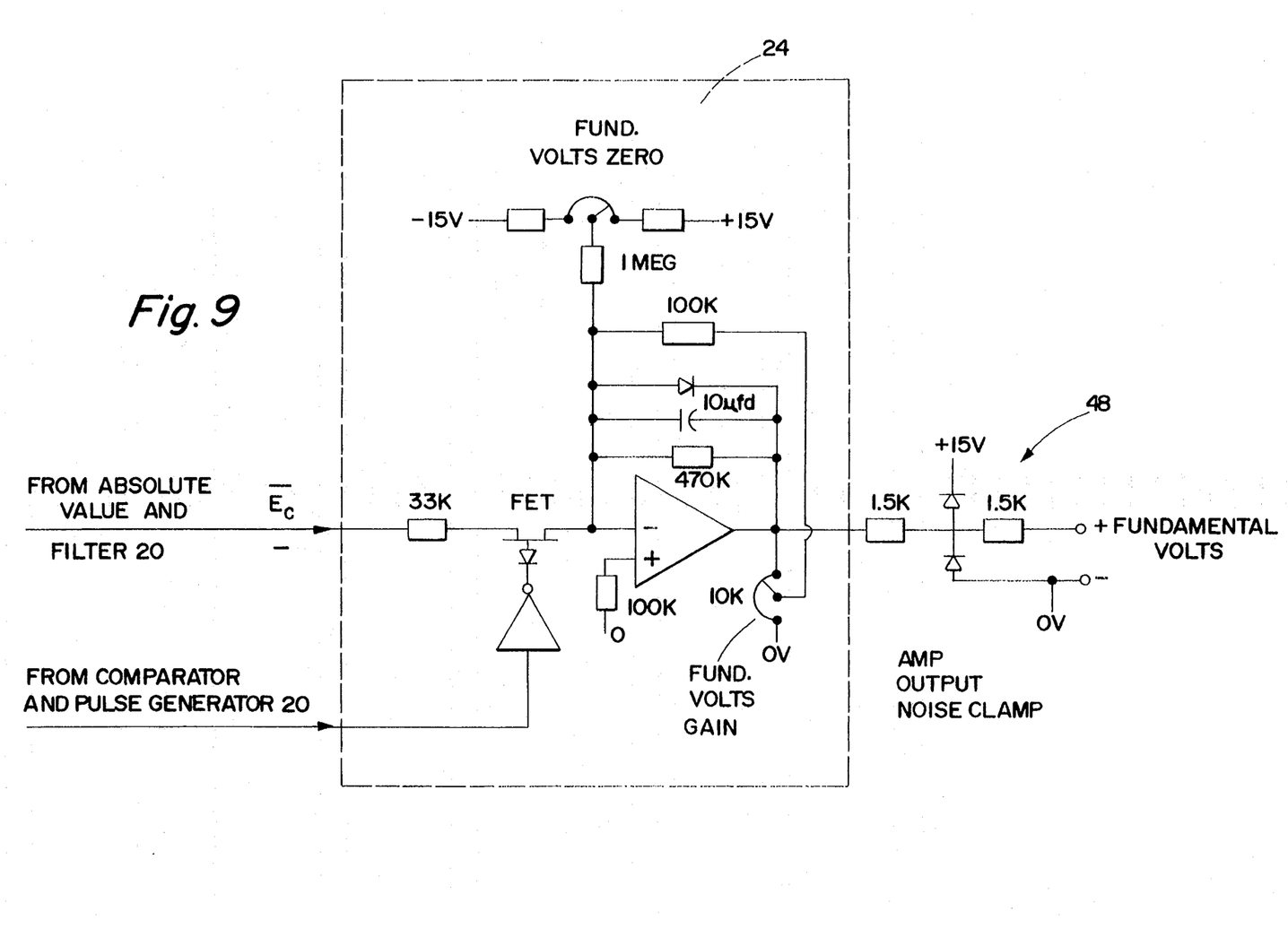
FIG. 9 is a schematic diagram of the multiplier and amplifier circuit utilized by the present invention.

The output signal $E_c$ produced by isolation amplifier 16 is processed by the absolute value and filter circuit 18, illustrated in FIG. 7, and is utilized as an input to multiplier and amplifier circuit 24. In effect, the absolute value and filter circuit 18 rectifies the output signal $E_c$, resulting in waveform c in FIG. 8, and filters same into a negative DC signal, illustrated as waveform d. This negative DC signal is applied to an input to multiplier and amplifier circuit 24, illustrated in FIG. 9. The fixed width pulse(pulse b) from the comparator and pulse generator circuit 20 is applied to another input to multiplier and amplifier circuit 24 which averages a signal having a fixed width w, height $E_{in}/f$ and period (1/f). The resultant is amplified to produce a DC output signal representative of the fundamental voltage of the output of the inverter 24, in accordance with the following equation:

$$\frac{w[E_{IN}/f]}{\text{PERIOD}} = \frac{wE_{IN}/f}{1/f} = wE_{IN2} KE_{IN} \qquad (7)$$

where
w = width of pulse
$E_{in}/f$ = height of pulse
f = frequency
k = constant The foregoing DC output signal, varies directly with the fundamental voltage of the output of the inverter 10. As in the case of amplifier and filter circuit 26, the output of multiplier and amplifier 24 is protected by a voltage clamp 48.

Figure 10:
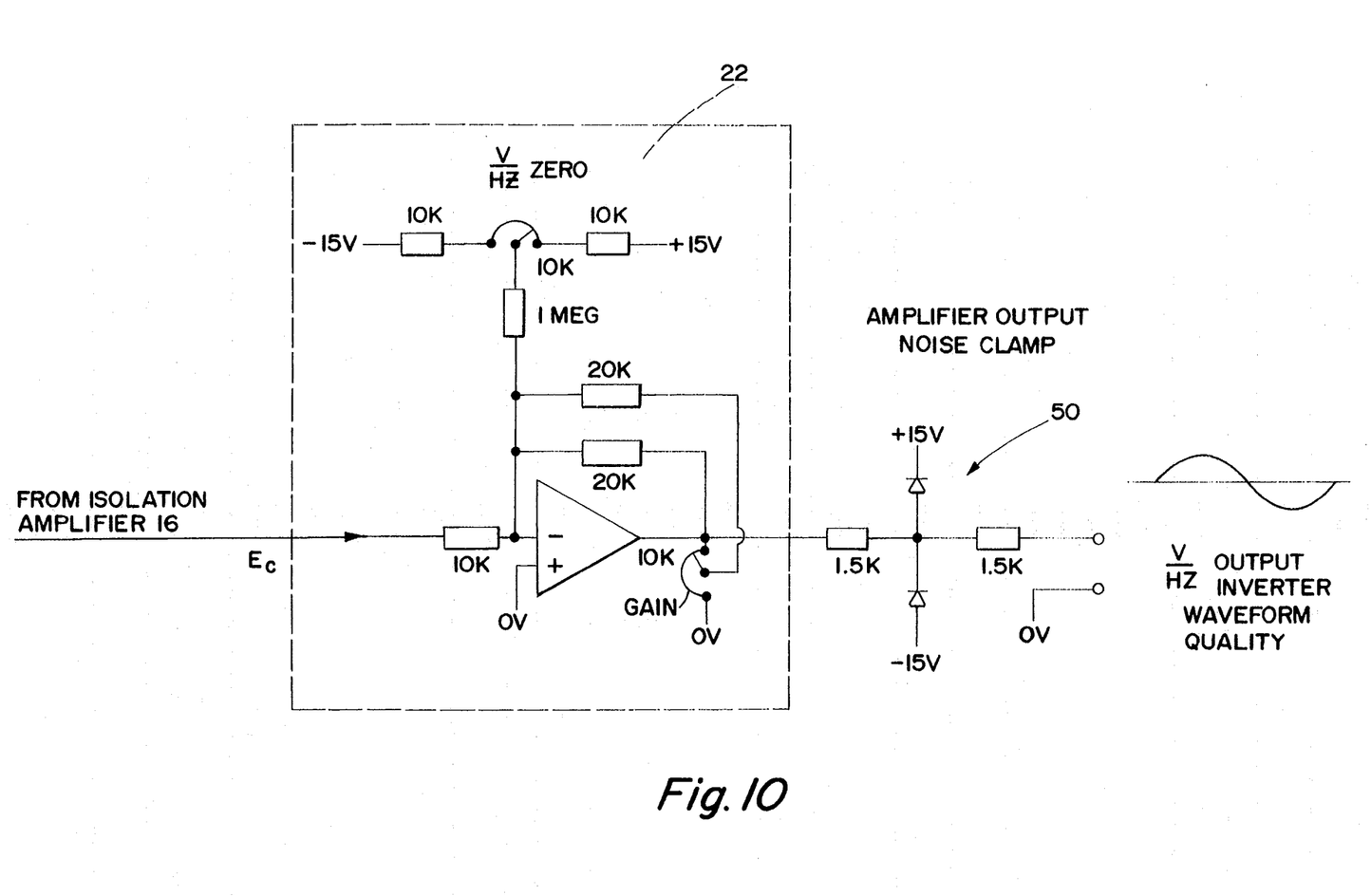
FIG. 10 is a schematic diagram of the amplifier circuit utilized by the present invention.

The output signal $E_c$ produced by isolation amplifier 16 is also amplified by amplifier 22, illustrated in FIG. 10, to produce an AC output signal, $E_{in}/f$, representative of the fundamental voltage of the output of the inverter 10 divided by the frequency of the fundamental voltage. Here again, the output of amplifier 22 is protected by a voltage clamp 50. The AC output signal can be measured by an rms voltmeter or an oscilloscope to determine the quality of the resulting waveform. The waveform can provide an indication of possible inverter switching malfunction. The output signals produced by the multiplier and amplifier circuit 24, amplifier and filter circuit 26, and amplifier 22 which are respectively representative of the fundamental voltage of the output of the inverter, the fundamental frequency of the output voltage of the inverter, and the fundamental voltage divided by the fundamental frequency of the output of the inverter can be connected to appropriate inputs to a portable digital meter to provide direct readings of the foregoing parameters. It has been found that the resulting measurements are much more accurate than those which can be obtained by a prior art techniques. For example, depending upon the voltage of the inverter DC bus, the error in fundamental voltage measurements is in the range of 1 to 3.0 percent, whereas prior art measuring devices had errors for similar inverter DC bus voltages in the range of 2 to 6 percent. With respect to the measurement of the output frequency of the voltage produced by the inverter, the present invention produces output frequency measurements having an error of between zero to two percent. Thus, the resulting measurements of fundamental voltage, fundamental frequency and fundamental voltage divided by fundamental frequency produced by the present invention are much more accurate than those produced by prior art measuring devices and/or techniques.

Certain modifications and improvements will occur to those skilled in the art upon reading the foregoing. It should be understood that all such modifications and improvements have been deleted herein for the sake of conciseness and read-ability, but are properly within the scope of the following claims.

I claim:

1. Apparatus for measuring various parameters that define the output produced by an inverter comprising means for producing a signal substantially proportional to the fundamental voltage of the output of the inverter divided by the fundamental frequency of the output of the inverter, means for producing a pulse representative of the period of the fundamental frequency of the output of the inverter, said pulse producing means being responsive to said signal produced by said signal producing means, and means for producing a signal substantially proportional to the fundamental voltage of the output of the inverter, said fundamental voltage signal producing means being responsive to said pulse produced by said pulse producing means.

2. The apparatus as defined in claim 1 wherein said fundamental voltage signal producing means comprises means for rectifying said signal substantially proportional to the fundamental voltage of the output of the inverter divided by the fundamental frequency of the output of the inverter, means for receiving said pulse representative of the period of the fundamental frequency of the output of the inverter, and means for combining said rectified signal and said pulse to produce said signal substantially proportional to the fundamental voltage of the output of the inverter.

3. The apparatus as defined in claim 1 wherein said means for producing a signal substantially proportional to the fundamental voltage of the output of the inverter divided by the fundamental frequency of the output of the inverter comprises means for isolating the inverter from said fundamental voltage signal producing means and said fundamental frequency signal producing means, said isolating means being electrically connected to the inverter and to said fundamental voltage signal producing means and said fundamental frequency signal producing means.

4. The apparatus as defined in claim 2 wherein said signal substantially proportional to the fundamental voltage of the output of the inverter is a DC signal.

5. The apparatus as defined in claim 1 wherein said pulse representative of the period of the fundamental frequency of the output of the inverter has a substantially constant width.

6. The apparatus as defined in claim 1 further including means for converting said pulse representative of the period of the fundamental frequency of the output of the inverter into a DC signal representative of the fundamental frequency of the output of the inverter.

7. The apparatus as defined in claim 1 further including means for amplifying said signal substantially proportional to the fundamental voltage of the output of the inverter divided by the fundamental frequency of the output of the inverter.

8. The apparatus as defined in claim 1 wherein said signal substantially proportional to the fundamental voltage of the output of the inverter divided by the fundamental frequency of the output of the inverter is an AC signal.

* * * * *